US012699154B2

(12) United States Patent
Giazotto et al.

(10) Patent No.: US 12,699,154 B2
(45) Date of Patent: Aug. 4, 2026

(54) QUANTUM MAGNETIC FIELD RECEIVING DEVICE

(71) Applicants: THE UNIVERSITY OF ADELAIDE, Adelaide (AU); Francesco Giazotto, Pisa (IT); Petar B. Atanackovic, Henley Beach (AU)

(72) Inventors: Francesco Giazotto, Pisa (IT); Petar B. Atanackovic, Henley Beach (AU); Giuseppe Carlo Tettamanzi, Beulah Park (AU); Isaac Nakone, Redwood Park (AU)

(73) Assignees: THE UNIVERSITY OF ADELAIDE (AU); Franzesco Giazotto (IT); Petar B. Atanackovic (AU)

( * ) Notice: Subject to any disclaimer, the term of this patent is extended or adjusted under 35 U.S.C. 154(b) by 157 days.

(21) Appl. No.: 18/709,322

(22) PCT Filed: Nov. 11, 2022

(86) PCT No.: PCT/AU2022/051343
§ 371 (c)(1),
(2) Date: May 10, 2024

(87) PCT Pub. No.: WO2023/081970
PCT Pub. Date: May 19, 2023

(65) Prior Publication Data
US 2025/0044380 A1 Feb. 6, 2025

(30) Foreign Application Priority Data
Nov. 11, 2021 (AU) ................................. 2021903616

(51) Int. Cl.
*G01R 33/035* (2006.01)

(52) U.S. Cl.
CPC ................................ *G01R 33/0354* (2013.01)

(58) Field of Classification Search
CPC .................................................. G01R 33/0354
See application file for complete search history.

(56) References Cited

U.S. PATENT DOCUMENTS

| | | | |
|---|---|---|---|
| 4,902,908 A | 2/1990 | Harada | |
| 9,097,751 B1 * | 8/2015 | Longhini | ........... G01R 33/0354 |
| 2019/0288177 A1 | 9/2019 | Fong et al. | |

OTHER PUBLICATIONS

Komev, V. K., et al., 'Bi-SQUID: designforapplications', 2020, Superconductor Science and Technology 33.11: 113001.
Berggren, S., et al., 'Effects of spread in critical currents for series-and parallel-coupled arrays of SQUIDs and Bi-SQUIDs','2014, IEEE Transactions on Applied Superconductivity 25.3: 1600304.
Volkov, AF., et al., 'Effect of gate voltage on critical current in controllable superconductor-normal-metal-superconductor Josephson junctions', 1996, Physical Review B 53.22: 15162.
(Continued)

*Primary Examiner* — Stephanie E Bloss
*Assistant Examiner* — Michael A Harrison
(74) *Attorney, Agent, or Firm* — Barnes & Thornburg LLP

(57) ABSTRACT
A quantum magnetic field receiving device includes a superconducting quantum interference device (SQUID) or a superconducting quantum interference filter (SQIF) and an electrostatic gating circuit configured to apply electrostatic fields to Josephson Junctions of the SQUID or SQIF.

10 Claims, 7 Drawing Sheets

(56) References Cited

OTHER PUBLICATIONS

Golokolenov, I., et al., On the origin of the controversial electrostatic field effect in superconductors, 2021, Nature communications 12.1, pp. 1-7 (published May 12, 2021).

Monteiro, AM. R. V. L., et al., 'Side gate tunable Josephsonjunctions at the LaA1O3/SrTiO3 interface', 2017, Nano letters 17.2, pp. 715-720.

Paolucci, F., et al., 'Field-Effect Control of Metallic Superconducting Systems',2019, arXiv preprint arXiv:1909.1272lv2.

Li, T., et al., 'Scalable, tunable josephsonjunctions and DC SQUIDs based on CVD graphene', 2019, IEEE Transactions on Applied Superconductivity 29. 5: 1101004.

De Simoni, G., et al., 'Gate-control of the current-flux relation of a Josephson quantum interferometer based on proxirnitized metallic nanojuntions', 2021, arXiv preprint arXiv:2106.03572v2 (published Jun. 8, 2021).

Korney_ V. K.. ct al.. 'Bi-SQUID: a novel lincarization method for dc SQUID voltage response'. 2009. Superconductor Science and Technology 22.11: 114011.

International Search Report and Written Opinion corresponding to PCT/AU2022/051343 dated Jan. 24, 2023.

* cited by examiner

QUANTUM MAGNETIC FIELD RECEIVING DEVICE

CROSS-REFERENCE TO RELATED APPLICATIONS

This patent application is a U.S. National Phase of International Patent Application No. PCT/AU2022/051343 filed 11 Nov. 2022, which claims priority to Australian Patent Application No. 2021903616, the disclosure of which being incorporated herein by reference in their entireties.

TECHNICAL FIELD

The present invention relates to a quantum magnetic field receiving device including a superconducting quantum interference device (SQUID) or a superconducting quantum interference filter (SQIF) and an electrostatic gating circuit configured to apply electrostatic fields to Josephson Junctions of the SQUID or SQIF.

In particular, but not exclusively, the Josephson Junctions are tuneable by applying electrostatic fields to the junction material of each of the Josephson Junctions, respectively, to tune critical supercurrents of the Josephson Junctions to improve the linearity of the magnetic flux-to-voltage response of the quantum magnetic field receiving device.

BACKGROUND OF INVENTION

Josephson Junctions, SQUIDs and SQIF may be used as the basic building blocks of superconducting micro-electronic devices when used in a quantum receiver configuration. Superconducting devices, such as those for large or very large-scale Integrated Circuits, are typically produced using integrated circuit fabrication techniques that are similar to those used in Complementary Metal-Oxide Semiconductor (CMOS) technology. That is, a number of superconducting, metallic and insulating layers of materials of different shapes are typically stacked in order to obtain the desired functionalities of the devices. The fabrication of these devices may thus require several hundred, if not thousands, of different steps. The sheer number and complexity of these steps makes the fabrication of such devices very difficult.

Thus, the science of fabricating these devices is often an empirical science as it is not completely possible to anticipate the combined behaviour of all the different steps and individual parts of the devices. While circuitry based on CMOS technology can be modelled and its behaviours can be anticipated, this is not the case for circuitry based on superconducting elements. Further, the physics of superconducting materials is extremely complicated, and this can make it very difficult to develop models that can reliably anticipate the behaviours of circuits that include superconducting elements, such as Josephson Junctions.

A Josephson Junction can be considered to be the workhorse equivalent in superconducting technology to the transistor device of semiconductor technology. A Josephson Junction (JJ) is created each time bulk superconductor material is interrupted by a thin barrier of insulating material or by a section of conducting material with inferior superconducting properties.

Two JJs can be used in conjunction with a closed loop of superconductor material to form a Superconducting Quantum Interference Device (DC-SQUID). This DC-SQUID device may be used as, for example, a high-performance interferometer as magnetic fields are repelled by the loop of superconducting material. The DC SQUID can thus form the backbone of quantum sensing (i.e. receiving) devices. Alternatively, the JJs can be used in a similar manner in a Superconducting Quantum Interference Filter (SQIF). SQIF devices is another superconducting device technology. A SQIF is a direct derivation of a DC SQUID as it is formed from an array of N superconductor loops FIG. 1 shows a schematic of a prior art DC-SQUID having a closed loop of superconducting material that encapsulates, in two symmetrical positions of the loop, two JJs: $JJ_1$ and $JJ_2$. A very sensitive Quantum Magnetic Field Receiver can be fabricated by incorporating many DC-SQUIDs in arrays. By using this technology, it is possible to observe a very high Signal-to-Noise Ratio (SNR). Indeed, DC SQUIDs have been utilised in many existing applications as advanced, high-performance electro-magnetic sensors, with sensitivity up to $10^{-15}$ T/$\sqrt{Hz}$ and Energy Sensitivity per Unit Bandwidth of around $10^{-28}$ Js. DC SQUIDs may thus form excellent sensors. However, as they naturally operate in the quantum regime as quantum interferometers, the magnetic flux-to-voltage response of a DC-SQUID device is intrinsically periodic and almost sinusoidal, as indicated in the dashed curve in FIG. 5.

Hence, devices utilising DC-SQUIDs generally operate in highly non-linear regimes. This makes their use in applications such as in a component for some Quantum Sensing (QS) schemes difficult. For many QS schemes, some of the most important requirements are directly linked to the linearity in the flux-to-voltage response output of sensors used in the schemes. That is, the linearity of the response indicates how close the curve of flux-to-voltage response is to an ideal straight line. This is important for QS schemes as it is this linearity of response that will ultimately determine how fast a sensor can operate and what is the fastest signal that can be efficiently discriminated from background noise and reliably acquired by the receiver.

In an ideal world, a quantum receiving or sensing device must be capable of capturing the fastest possible signal and to operate as fast as possible in conjunction with analogue-to-digital conversion devices. A typical solution that is used to overcome the limits in term of linearity of DC SQUIDs is to associate each DC SQUID with a control circuit. However, this greatly increases the Size Weight and Power (SWaP) of such a device and ultimately deteriorates its performance. The extra circuitry especially heavily affects the bandwidth (BW) performance of such a device thus making it less suitable for quantum sensing applications.

To overcome at least some of the abovementioned limitations, the concept of a Bi-SQUID has been introduced. An example of an existing Bi-SQUID, as shown in FIG. 2, consists basically of a DC SQUID interrupted by a third arm which contains a third JJ, $JJ_3$, connecting the two-spaced apart arms. In respect of the Bi-SQUID, the non-linearity of the original DC SQUID loop (i.e. of the interferometer between JJ1 and $JJ_2$) and the non-linearity of the third arm (i.e. of the single junction, $JJ_3$) work against each other to ultimately provide very good performance in terms of the linearity of magnetic flux-to-voltage response. The linearity is shown in the triangular shaped flux-to-voltage response in solid line in FIG. 5.

Indeed, if ideally engineered, a device utilising Bi-SQUIDs can perform superbly in term of linearity without the need for extra circuitry which would degrade its performance in terms of bandwidth, SWaP and SNR. However, to obtain such performances, the device must be engineered with a good degree of control and symmetry between the values of the critical currents of the JJs in the original DC SQUID loop and this is not always possible during fabrication. Furthermore, to obtain the best performances in terms of linearity, it is also important to align the value of the critical current in the third JJ of the Bi-SQUID, i.e. Ic (JJ$_3$), to the critical current in the other JJs. The value of a critical super-current of a JJ can be in the order of hundreds of nano-Ampere to hundreds of micro-Ampere and the value depends on the geometry of the JJ and on the superconducting material. It will be appreciated by those persons skilled in the art that, given the complexity of fabrication, it is very difficult to achieve these ideal JJ critical current values in practice.

A reference herein to a patent document or other matter which is given as prior art is not to be taken as an admission that that document or matter was known or that the information it contains was part of the common general knowledge at the priority date of any of the disclosure or claims herein. Such discussion of prior art in this specification is included to explain the context of the present invention in terms of the inventors' knowledge and experience.

SUMMARY OF INVENTION

According to one aspect of the present invention, there is provided a quantum magnetic field receiving device, including: a superconducting quantum interference device (SQUID) including: a superconducting loop including a first arm spaced apart from a second arm; a first Josephson Junction in the first arm; a second Josephson Junction in the second arm; a third arm electrically connecting the first arm and the second arm; a third Josephson Junction in the third arm, wherein each of the three Josephson Junctions has a junction material; and an electrostatic gating circuit configured to apply a first electrostatic field to the first Josephson Junction and a second electrostatic field to the second Josephson Junction, wherein a first critical supercurrent of the junction material of the first Josephson Junction is tuneable by applying the first electrostatic field to the junction material effected by a first gate voltage provided by the electrostatic gating circuit and a second critical super-current of the junction material of the second Josephson Junction is tuneable by applying the second electrostatic field to the junction material effected by a second gate voltage provided by the electrostatic gating circuit, and wherein the first critical supercurrent is tuned to substantially equal the second supercurrent to improve linearity of magnetic flux-to-voltage response of the quantum magnetic field receiving device.

Preferably, the SQUID is a Bi-SQUID. It will be appreciated by those persons skilled in the art, however, that other configurations of superconducting quantum interference devices could be used, such as a device having a fourth arm that electrically connects the first arm and the second arm to form three superconducting loops.

As mentioned, it is very hard to control the value of the critical currents during fabrication of these devices. The above quantum magnetic field receiving device with the electrostatic gating circuit thus has the ability to control the critical currents of the Josephson Junctions after fabrication and during operation of the device. The quantum magnetic field receiving device takes advantage of the voltage gating effects to tune the Josephson Junctions by applying an electrostatic field to the Josephson Junctions. This device thus has improved linear response that is closer to the theoretical ideal linear response.

Accordingly, improved superconducting micro-electronic devices can be fabricated using the above quantum magnetic field receiving devices as basic building blocks. These devices may be suitable for very sensitive Quantum Sensing applications. Indeed, the rapidity of operation of the quantum magnetic field receiving devices will also directly impact the speed of analogue-to-digital conversion and, as such, the amount of information that can be transferred during this conversion is directly linked to the linearity of the response of the devices.

That is, the above quantum magnetic field receiving device has the ability to modify its electrical properties after fabrication so that its performance can be optimised. As mentioned, full control of the circuitry of the device during fabrication is not completely possible. Hence, having the ability to modify some of the device characteristics with external electrical fields using voltage gating after fabrication is an important advantage for this device.

Often, Josephson Junctions are fabricated using metallic superconducting wires or Dayem bridges. These implementations of Josephson Junctions are often described as superconducting weak-links. The critical current of Josephson Junctions fabricated in this manner can be controlled by applying a DC voltage bias to either a back gate or to a nearby split-gate electrode capacitively-coupled to the superconducting weak links. By means of such a gate voltage, it is possible to drive the superconductor into a completely resistive state. The gate voltage values required to realize the critical current control lie in the range spanning a few Volts up to tens of Volts and depend mainly on the spatial gap between the gate electrode and the superconducting weak links.

In an embodiment, the first and the second critical supercurrent are tuned relative to a third critical supercurrent of the junction material of the third Josephson Junction. The ratio of the first and the second critical supercurrent to the third critical supercurrent is preferably 0.5 to 1.5. In the embodiment, the third critical supercurrent of the junction material of the third Josephson Junction is tuneable by applying a third electrostatic field to the junction material effected by a third gate voltage provided by the electrostatic gating circuit.

In an embodiment, an inductance in the first arm is tuned by the electrostatic gating circuit to substantially equal an inductance in the second arm. In another embodiment, an inductance in the first arm and an inductance in the second arm is tuned by the electrostatic gating circuit to optimise a Spurious Free Dynamic Range of the quantum magnetic field receiving device. Preferably, an optimised value of the Spurious Free Dynamic Range is close to 100 dB.

According to another aspect of the present invention, there is provided a quantum magnetic field receiving device, including: a superconducting quantum interference filter (SQIF) including: two or more superconducting loops, each including a first arm spaced apart from a second arm, wherein a second arm of a first superconducting loop forms a first arm of a second superconducting loop; a first Josephson Junction in the first arm of the first superconducting loop; a second Josephson Junction in the second arm of the first superconducting loop which forms the first arm of the second superconducting loop; and a third Josephson Junction in the second arm of second superconducting loop, wherein each of the Josephson Junctions has a junction material; and an electrostatic gating circuit configured to apply a first electrostatic field to the first Josephson Junction, a second electrostatic field to the second Josephson Junction, and a third electrostatic field to the third Josephson Junction, wherein a first critical supercurrent of the junction material of the first Josephson Junction is tuneable by applying the first electrostatic field to the junction material effected by a first gate voltage provided by the electrostatic gating circuit and a second critical supercurrent of the junction material of the second Josephson Junction is tuneable by applying the second electrostatic field to the junction material effected by a second gate voltage provided by the electrostatic gating circuit and a third critical supercurrent of the junction material of the third Josephson Junction is tuneable by applying the third electrostatic field to the junction material effected by a third gate voltage provided by the electrostatic gating circuit, and wherein the first, second and third critical supercurrents are tuned to be substantially equal to improve linearity of magnetic flux-to-voltage response of the quantum magnetic field receiving device.

This quantum magnetic field receiving device, with the electrostatic gating circuit, uses the same approach as mentioned above to control the critical currents of the Josephson Junctions of the SQIF after fabrication and during operation. A very sensitive Quantum Sensing device can also be fabricated from such a quantum magnetic field receiving device with improved linearity of response, as well as improved SWaP, BW and SNR. SQIFs thus also benefit greatly from the ability of being able to control the critical currents of some or all the Josephson Junctions in their circuitry after fabrication and during operation.

In an embodiment, an inductance in the first arm of the first superconducting loop is tuned by the electrostatic gating circuit to substantially equal an inductance in the second arm of the first superconducting loop. In another embodiment, an inductance in the first arm and an inductance in the second arm is tuned by the electrostatic gating circuit to optimise a Spurious Free Dynamic Range of the quantum magnetic field receiving device. Preferably, an optimised value of the Spurious Free Dynamic Range is close to 100 dB.

BRIEF DESCRIPTION OF DRAWINGS

A preferred embodiment of the present invention will now be described with reference to the accompanying drawings wherein.

DETAILED DESCRIPTION

Figures 1, 2:
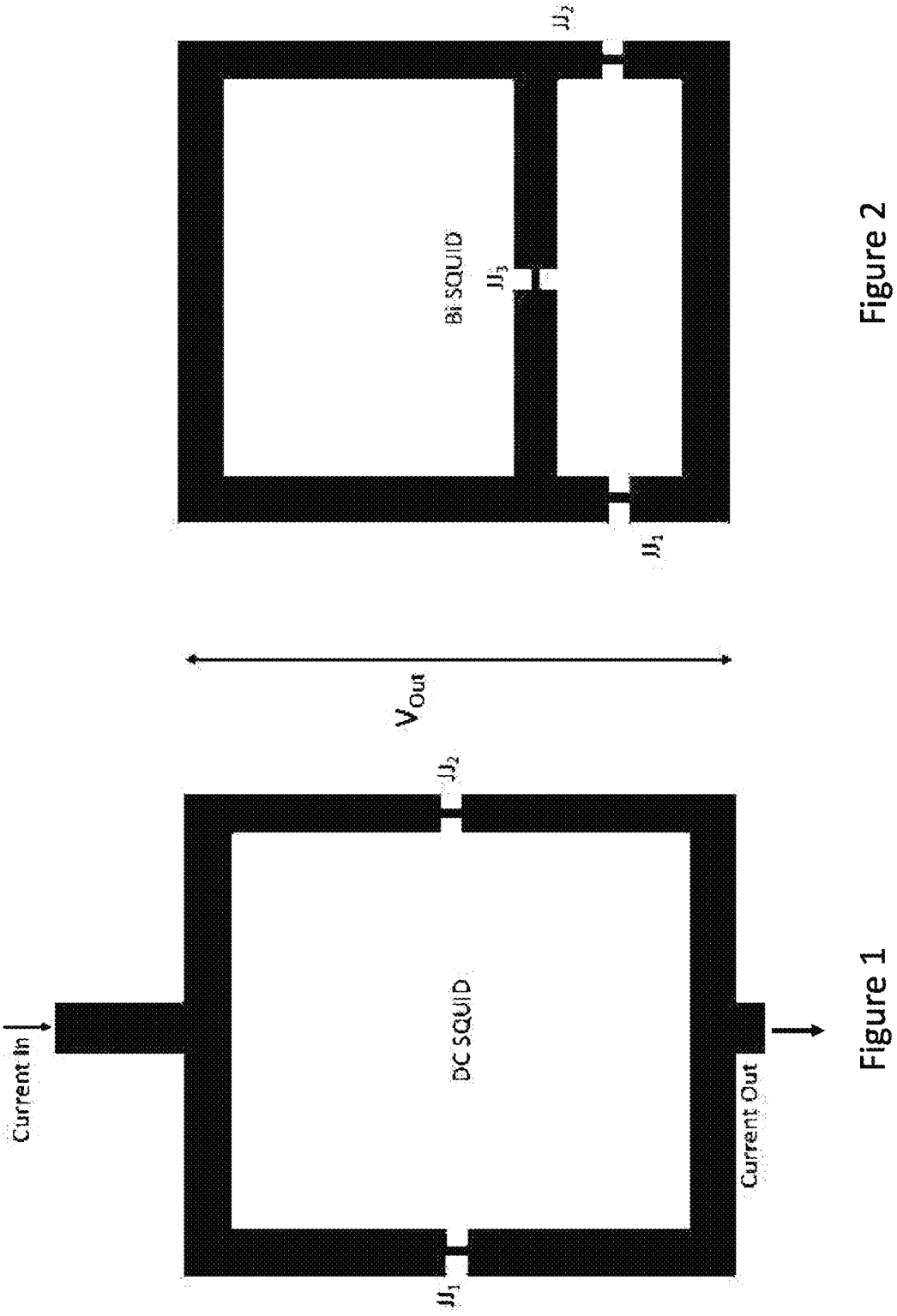
FIG. 1 is a schematic of a DC-SQUID.
FIG. 2 is a schematic of a Bi-SQUID.

A quantum magnetic field receiving device 10 according to an embodiment of the present invention is shown in FIG.

3. The device 10 includes a superconducting quantum interference device (Bi-SQUID) 12 including a superconducting loop 14 including a first arm 16, a second arm 18 spaced apart from the first arm 16, and a third arm 20 electrically connecting the first arm 16 and the second arm 18.

The Bi-SQUID 12 includes a first Josephson Junction $JJ_1$ in the first arm 16, a second Josephson Junction $JJ_2$ in the second arm 18, and a third Josephson Junction $JJ_3$ in the third arm 20. Each of the three Josephson Junctions $JJ_1$ $JJ_2$ $JJ_3$ has a junction material, such as a thin barrier of insulating material or conducting material with inferior superconducting properties, as described above. It will be appreciated by those persons skilled in the art that the superconducting loop 14 is made with material with superconducting properties when operating at temperatures below the critical temperatures of the superconducting material.

The device 10 further includes an electrostatic gating circuit 22 configured to apply a first electrostatic field to the first Josephson Junction $JJ_1$, a second electrostatic field to the second Josephson Junction $JJ_2$, and a third electrostatic field to the third Josephson Junction $JJ_3$.

The Applicant denotes this device 10 as a Tettamanzi-Giazotto-Nakone Bi-SQUID; a novel quantum magnetic field receiving device.

Accordingly, a first critical supercurrent $I_{c1}$ of the junction material of the first Josephson Junction $JJ_1$ is tuneable by applying the first electrostatic field to the junction material effected by a first gate voltage provided by the electrostatic gating circuit 22 and a second critical supercurrent $I_{c2}$ of the junction material of the second Josephson Junction $JJ_2$ is tuneable by applying the second electrostatic field to the junction material effected by a second gate voltage provided by the electrostatic gating circuit 22. The values of $I_{c1}$ and $I_{c2}$ can be between nano-Ampere and micro-Ampere.

In an embodiment, a third critical supercurrent $I_{c3}$ of the junction material of the third Josephson Junction $JJ_3$ is also tuneable by applying a third electrostatic field to the junction material effected by a third gate voltage provided by the electrostatic gating circuit 22. The values of $I_{c3}$ can be between nano-Ampere and micro-Ampere.

The first critical supercurrent $I_{c1}$ is tuned to substantially equal the second supercurrent $I_{c2}$ to improve linearity of magnetic flux-to-voltage response of the quantum magnetic field receiving device. As mentioned, the linearity of magnetic flux-to-voltage response for a device with an ideally fabricated Bi-SQUID is shown in the solid line in FIG. 5.

Figures 4, 5, 6:
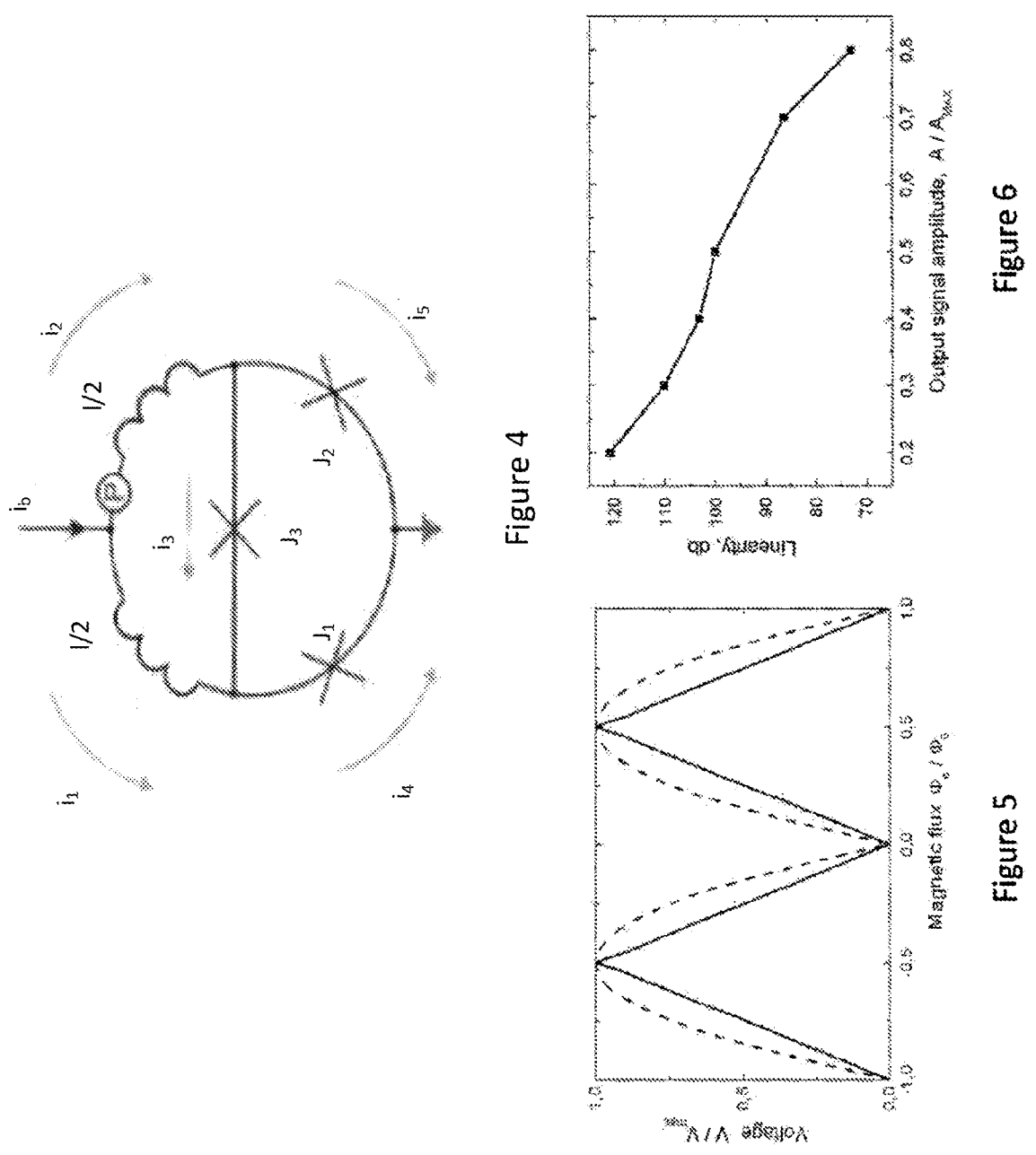
FIG. 4 is a schematic of a Bi-SQUID RSJ model.
FIG. 5 is a graph of a DC-SQUID and a Bi-SQUID magnetic flux-to-voltage response.
FIG. 6 is a graph of the linearity of magnetic flux-to-voltage response versus normalised loop inductance values of a Bi-SQUID extracted from the results of FIG. 5 obtained with the RSJ model.
Figure 7:
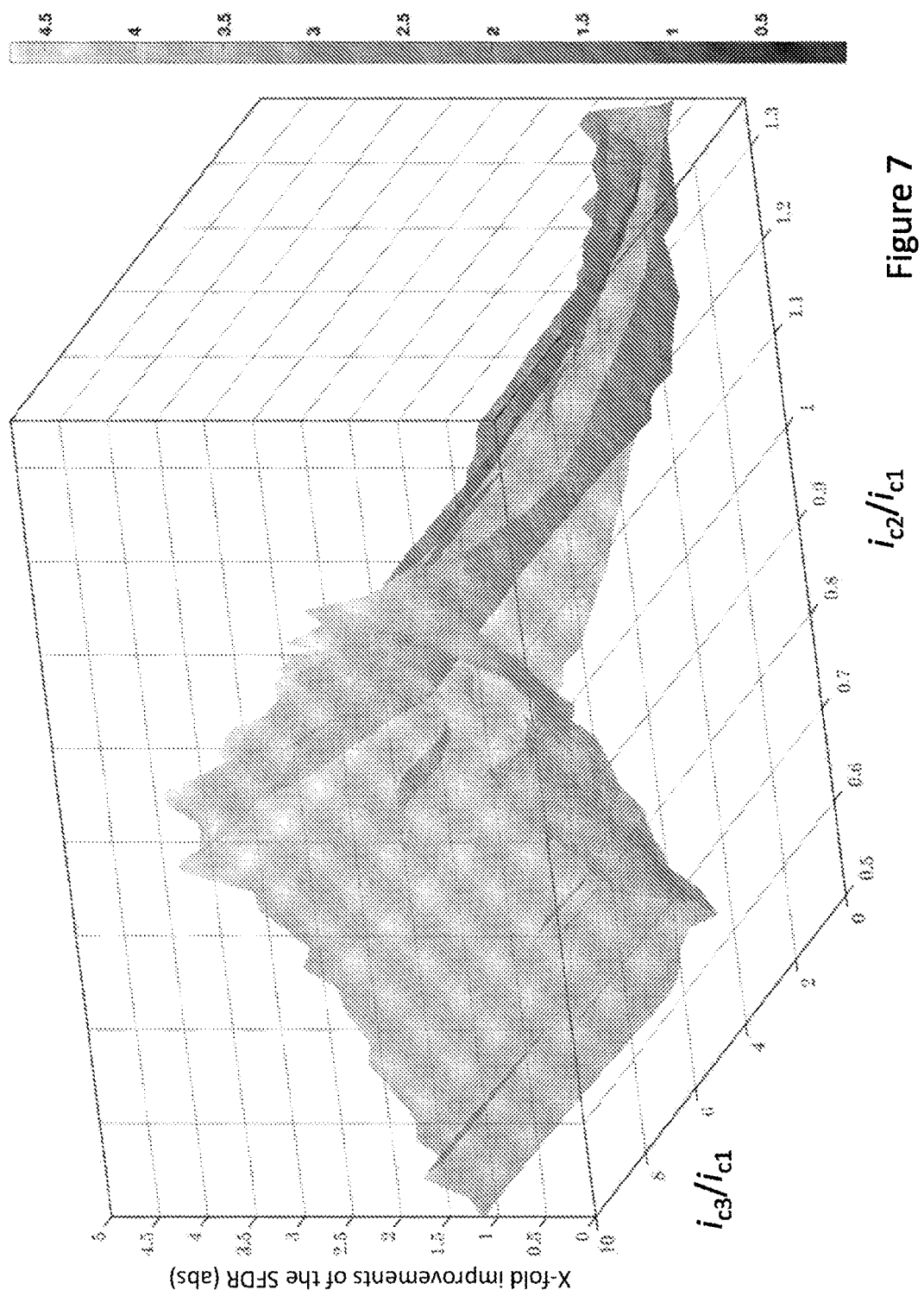
FIG. 7 is a graph showing theoretical improvement in linearity of magnetic flux-to-voltage response of a Bi-SQUID with different critical currents compared to a DC-SQUID that is obtained with an RSJ model.

Also, theoretical predictions, obtained using an RSJ model shown in FIG. 4, of the linearity of magnetic flux-to-voltage response for different critical currents is shown in FIG. 7. These predictions indicate how it is possible to improve performance of a BI-SQUID after fabrication by tuning the critical currents to improve the linearity of magnetic flux-to-voltage response. More specifically, FIG. 7 indicates how control on the different critical currents of the JJ's of the device 10 can lead to an X-fold improvement (with X>1) in the linearity of magnetic flux-to-voltage response of the device 10.

The gate-Josephson junction gap can be made as small as 10-15 nm with the aid of standard electron-beam lithography techniques, so that a sizable reduction of gating voltage can be used for the device 10. In addition, electric gating is very effective both on genuine and proximitized superconductors like copper (Cu) so that, whenever superconducting correlations are established within a non-superconducting metal, it is possible to suppress superconductivity and tune the critical currents. As a consequence, the Josephson Junctions of the superconducting quantum receiving device 10 have a fully-tuneable response.

Moreover, in experiments carried out on elemental superconductors characterised by different critical temperatures ($T_c$), effective tunability has been demonstrated on Titanium (Ti, $T_c$~0.4K), Aluminium (Al, $T_c$~1.4K), Vanadium (V, $T_c$~4K), and Niobium (Nb, $T_c$~9K). Superconductors with larger critical temperatures, such as NbB or NbTiN, can be exploited as well.

Because of the ability to tune the values of the critical currents $I_{c1}$ (for $JJ_1$) and $I_{c2}$ (for $JJ_2$), the device 10 can operate a Bi-SQUID in ideal conditions. The device 10 can thus tune the ratio between $I_{c1}$ ($JJ_1$) and $I_{c2}$ ($JJ_2$), and $I_{c3}$ ($JJ_3$). The ratio of the first and the second critical supercurrents $I_{c1}$ $I_{c2}$ to the third critical supercurrent $I_{c3}$ is preferably 0.5 to 1.5. Further, the device 10 in this manner tunes the inductance in the first arm 16 to substantially equal the inductance in the second arm 18. The device 10 thus has the potential to operate with an "in principle" infinitely high linearity in the Magnetic Flux-to-Voltage response, and with the best performance in term of BW and SNR (sensitivity). The Applicant notes that conventional superconductivity (e.g. low temperature superconductors) arise under the effects of the so-called spin-singlet superconductivity. That is, when superconductivity is active at temperatures below the critical temperature of the materials, electrons lose their individuality as quantum particles and form a combined many-body spin-singlet wave-function that controls the behaviour of all the electrons in the materials. This physical mechanism is exploited by the electrostatic gating circuit 22 of the device 10 to achieve electrical control over the critical currents $I_{c1}$ $I_{c2}$ $I_{c3}$.

The spin-singlet superconductivity mechanism being affected by external gate voltages is far from being completely explained. Some theories have studied how thin films can be affected by external fields by focusing on the role of surface orbital polarization. These can be summarised as follows.

Assuming a multi-orbital description of the metallic state due to screening effects, the electric field acts by modifying the strength of the surface potential and, in turn, yields non-trivial orbital-Rashba couplings. The resulting orbital polarization at the surface and in its close proximity is shown to have a dramatic impact on superconductivity. This can be demonstrated by the fact that, by varying the strength of the electric field, the superconducting phase can be either suppressed, i.e. turned into normal metal, or undergo a 0–π transition, with the π phase being marked by non-trivial sign change of the superconducting order parameter between different bands. These findings enable the design of heterostructures with superconducting orbitronics effects. In the case of Josephson Junctions, the Applicant suggests that superconducting metal (e.g. Aluminium) nano-bridges can be driven into a state with complete suppression of the critical supercurrent via electrostatic gating.

Probing both in- and out-of-plane magnetic field responses in the presence of electrostatic gating can unveil the mechanisms that primarily cause the superconducting electric field effects. The Applicant found that a magnetic field, independent of its orientation, has only a weak influence on the critical electric field that identifies the transition from the superconducting state to a phase with vanishing critical supercurrent. This observation points to the absence of a direct coupling between the electric field and the amplitude of the superconducting order parameter or 2π-phase slips via vortex generation.

The magnetic field effect observed in the presence of electrostatic gating is well described within a microscopic scenario where a spatially uniform inter-band π-phase is stabilized by the electric field. Such an intrinsic superconducting phase rearrangement can account for the suppression of the supercurrent, as well as for the weak dependence of the critical magnetic fields on the electric field.

As discussed above, it is extremely complicated to fully anticipate the behaviours of superconducting materials. This is even more so for devices made out of superconducting materials. This is because superconductivity arises as a consequence of microscopic many-body effects and as such there is no model that can be used to describe with precision the electro-magnetic response of these systems. For some superconducting materials, e.g. high critical temperature materials such as YBCO, there is not even an agreement on which microscopic mechanism is causing the effect. One of the few available ways that can be used to anticipate the behaviours of devices made out of superconducting materials is by making use of a Lumped-element approach. For superconducting devices, this approach is a Resistive Shunted Josephson Junction (RSJ) model.

FIG. 4 shows a schematic of an exemplary Bi-SQUID as it is used in the RSJ model. Each X represents a Josephson Junction with critical currents $i_1$ or $i_2$ or $i_3$ and L is an ideal self-inductance for each half of the loop.

As an example of this, in respect of the RSJ model of a Bi-SQUID of FIG. 4, can be modelled following the approximations. The main conditions of this lumped element approach are described below.

A) To Use Kirchhoff's and Ohm's laws in each loop and at each node.

B) To assume that the critical currents in junctions 1 and 2 are such that $i_{c1}=i_{c2}=i_c$.

C) To assume that the values of the inductances are symmetrical.

D) To use the formula (linked to fundamental quantum mechanism of operation of a Josephson junction) that describes the ideal dynamical response of a Josephson junction, i.e. $i(t)=\sin \varphi(t)+d\,\varphi(t)/dt$, with $\varphi(t)$ being the phase in the junction.

The $d\,\varphi(t)/dt$ is to be linked to difference in the electrical potential acquired $\Delta V$ for each junction, while the $\varphi(t)$ can be linked to the flux of each external magnetic field (i.e. $\Phi_e$). As a consequence, the following equation can be expressed in terms of standard normalized values, $\Phi_o$ is the value of the quantum flux:

$$i_b = i_1 + i_2,\ i_1 + i_3 = i_4 \ _{and} i_2 = i_3 + i_5$$

$$i_{1\ or\ 2\ or\ 3} = \sin[\varphi_{1\ or\ 2\ or\ 3}] + d[\varphi_{1\ or\ 2\ or\ 3}]/dt.$$

$$\varphi_1 + L/2 * i_1 = \Phi_e/\Phi_o + \varphi_2 + L/2 * i_2 \text{ and } \varphi_1 + \varphi_2 = \varphi_3.$$

$$\text{and } d[\varphi_1]/dt + d[\varphi_2]/dt = d[\varphi_3]/dt.$$

Ultimately, these equations give rise to a system of non-linear differential equations of the 1$^{st}$ order. These equations can then be solved so that it is possible to extract the dynamic of the voltage response of a Bi-SQUID (and of many other kinds of superconducting devices) versus $\Phi_e$ ($V_{out}$ vs $\Phi_e/\Phi_o$) which is normalized magnetic flux ($=\int_S B_{external} \cdot dS$) directly linked to all external magnetic fields.

Typical results for these kinds of models for a BI-SQUID are shown in FIG. 5. FIG. 5 shows the dependence of a Bi-SQUID voltage versus normalized magnetic flux. It can be seen from FIG. 5 that, in the hypothetical situation of a perfectly symmetrical device, i.e. $i_{c1}=i_{c2}=i_c$, and inductances being perfectly symmetrical, such a device is able to have a $V_{out}$ vs $\Phi_e/\Phi_o$ response curve manifesting extremely high linearity.

FIG. 6 shows the linearity of response versus different amplitudes of output signals. Here, the critical current and values of normalized loop inductance L at bias current $I_b=2I_c$ and $I_{c3}$ are kept fixed at optimal values. In qualitative terms, the linearity is an indication of how straight (linear) the curve is. In quantitative terms, the linearity of the $V_{out}$ vs $\Phi_e/\Phi_o$ curve can be extracted by using the Spurious Free Dynamic Range (SFDR) in unit of dB's.

The electrostatic gating circuit 22 of the device 10 can be used to tune the inductance in the first arm 16 and the inductance in the second arm 18 to optimise the SFDR of the quantum magnetic field receiving device. The SFDR is an indication of how much a signal that is acquired by this kind of quantum receiving device is distorted by the device 10. The higher the linearity, the less the signal is being distorted and the greater amount of information/signal (and faster) can be processed via the device 10. Ultimately, FIG. 6 shows that ideally linearity above 100 dB can be obtained. The Applicant notes that this value is higher than one that is obtained with any other solid-state technology, which is especially important as it can be obtained for very fast varying electro-magnetic fields.

The modelling results shown in FIG. 5 have been obtained by assuming that: a) the critical currents in Josephson Junctions $JJ_1$ and $JJ_2$ are such that $I_{c1}=I_{c2}=I_c$; and b) that the values of the inductances on the left and right sides of the circuit are assumed to be completely symmetrical. As mentioned, conditions a) and b) are far from being easily achievable in real device circuitry, and this means that the linearity that is observed in real Bi-SQUID devices can never match its full ideal potentialities, in term of linearity performances.

The Applicant notes that these conditions can only be found in theory unless the device 10 is employed with its electrostatic gating circuit 22 to tune the Josephson Junctions. As an example, when the above model is run with more realistic (and much less symmetric) values for the device parameters, the linearity in the response cannot exceed 30-40 dB. While this may be better than many other quantum receivers based on superconducting devices, it is still only one third of what the best theoretical predictions are anticipating for this technology. Note that the linearity is expressed in dB, where each dB is related to an order of magnitude improvement, so a three times improvement in dB represents a very large improvement of several order of magnitude.

FIG. 7 demonstrates how, by varying the ratio between the critical currents of $JJ_2$ or $JJ_3$ versus the critical current of $JJ_1$, the theoretical performance of the linearity of the magnetic flux-to-voltage response of a bi-SQUID can be improved considerably. That is, FIG. 7 shows X-fold improvements of the linearity of a Bi-SQUID response compared to a typical DC-SQUID response expressed as SFDR, where X is greater than 1 and less than 5. It can be seen that the greatest improvement in SFDR is found when the first critical supercurrent $i_{c1}$ is substantially equal the second supercurrent $i_{c2}$. As mentioned, as this is very difficult to achieve during fabrication of a Bi-SQUID, the device 10 utilises the electrostatic gating circuit 22 to control critical currents after fabrication.

The electrostatic gating circuit 22 of the device 10 can therefore be used to change and to control critical currents in the above manner and self-inductances of parts of the Bi-SQUID 14. Hence, it is possible to return a fabricated Bi-SQUID to its ideal conditions of operation via use of the electrostatic gating circuit 22 of device 10. That is, it is expected that, by making use of the possibility of changing the values of the $I_c$'s and of the self-inductances after fabrication of a Bi-SQUID, it is possible to achieve a very high linearity in the $V_{out}$ vs $\Phi_e/\Phi_o$ response of the device 10.

Figure 8:
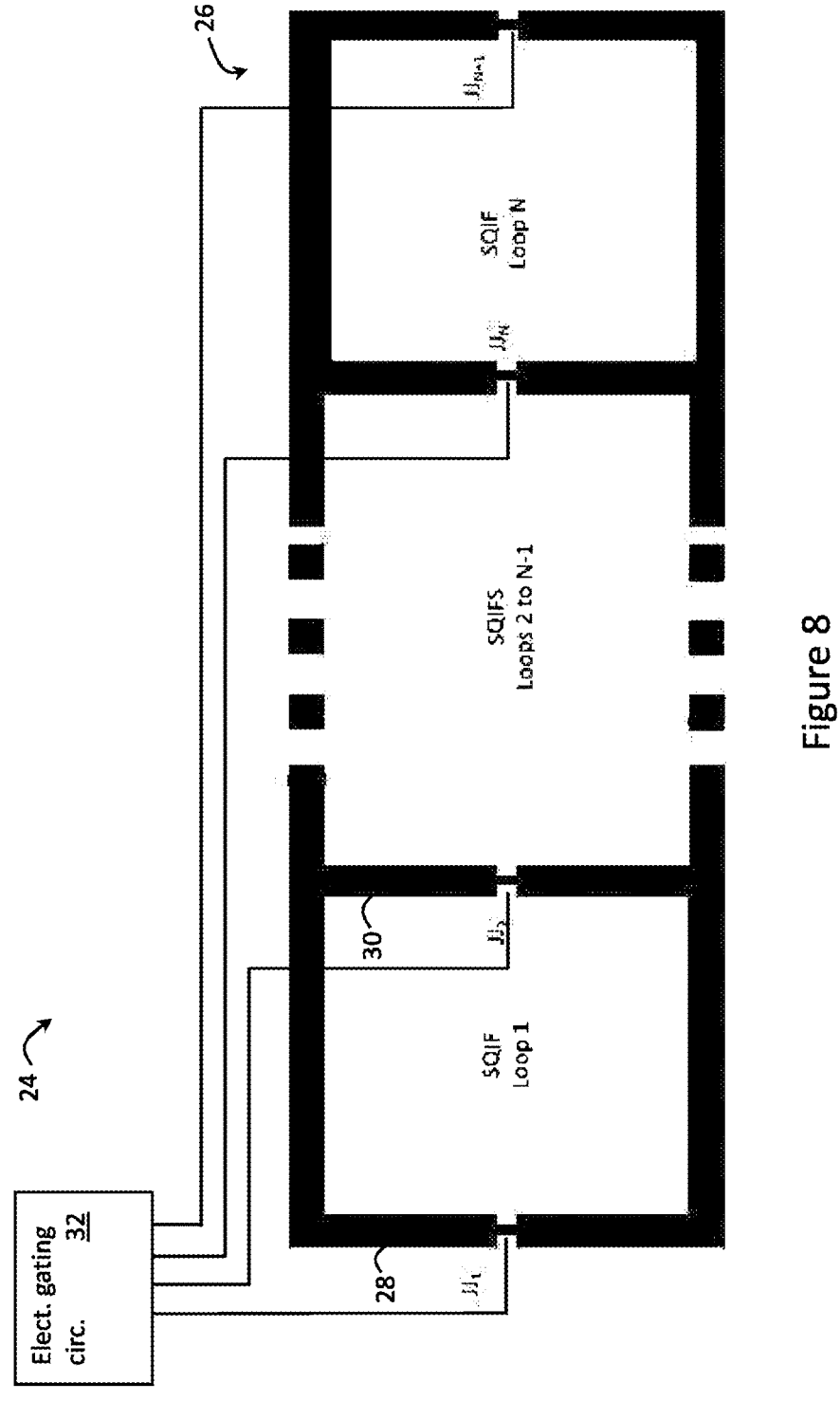
FIG. 8 is a schematic of a quantum magnetic field receiving device according to another embodiment of the present invention.

Another quantum magnetic field receiving device 20 including a superconducting quantum interference filter (SQIF) 24 is shown in FIG. 8. The SQIF 24 employs the same approach that is described above for improved linearity of response in, for example, Quantum Sensing applications. That is, SQIFs represent another device technology which is a direct derivation of the DC SQUID and which benefits greatly from the ability of being able to control the critical current of some or all of the Josephson Junctions in their circuitry after fabrication and during operation. This control over the critical currents of all or some of the JJs incorporated in the SQIF 26 improves the performance of the device 24 in terms of its linearity, SWaP, BW and SNR.

The SQIF 26 of FIG. 8 includes N superconducting Loop1, 2, . . . N, each of the loops including a first arm 28 spaced apart from a second arm 30. The second arm 30 of a first superconducting loop Loop1 forms a first arm of a second superconducting loop Loop2, and so forth. The first arm 28 of the first superconducting loop Loop1 has a first Josephson Junction $JJ_1$. The second arm 30 of the first superconducting loop Loop1 has a second Josephson Junction $JJ_2$, and so forth, such that an Nth loop LoopN has an Nth Josephson Junction $JJ_N$ in its first arm and a N+1 Josephson Junction $JJ_{N+1}$ in its second arm.

As above, each of the Josephson Junctions $JJ_1 \ldots J_{N+1}$ has a junction material and the device 24 has an electrostatic gating circuit 32 configured to apply an electrostatic field to the Josephson Junctions. For instance, a first electrostatic field is applied to the first Josephson Junction $JJ_1$, a second electrostatic field to the second Josephson Junction $JJ_2$, an Nth electrostatic field to the Nth Josephson Junction $JJ_N$, and N+1th electrostatic field to the N+1th Josephson Junction $JJ_N+1$. Also as above, it will be appreciated that the SQIF 26 is made with material with superconducting properties when operating at temperatures below the critical temperatures of the superconducting material.

A first critical supercurrent of the junction material of the first Josephson Junction $JJ_1$ is thus tuneable by applying the first electrostatic field to the junction material effected by a first gate voltage provided by the electrostatic gating circuit 32. A second critical supercurrent of the junction material of the second Josephson Junction $JJ_2$ is tuneable by applying a second electrostatic field to the junction material effected by a second gate voltage provided by the electrostatic gating circuit 32. A third critical supercurrent of the junction material of the third Josephson Junction $JJ_3$ is tuneable by applying a third electrostatic field to the junction material effected by a third gate voltage provided by the electrostatic gating circuit 32, and so forth. The first, second, third, through to N+1th critical supercurrents are thus all tuned by the electrostatic gating circuit 32 so as to improve the linearity of magnetic flux-to-voltage response of this quantum magnetic field receiving device 24.

Figure 3:
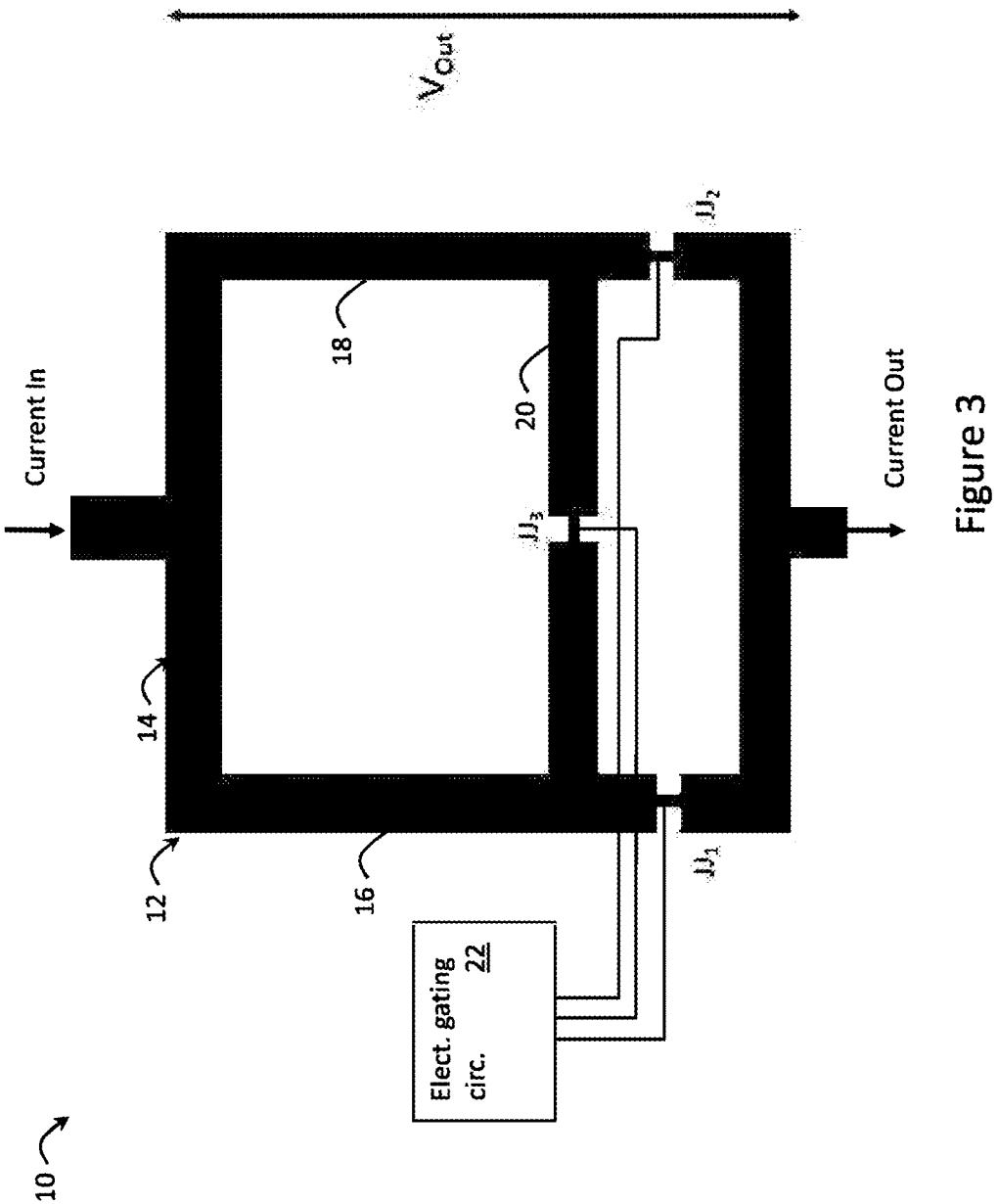
FIG. 3 is a schematic of a quantum magnetic field receiving device according to an embodiment of the present invention.
Figure 9:
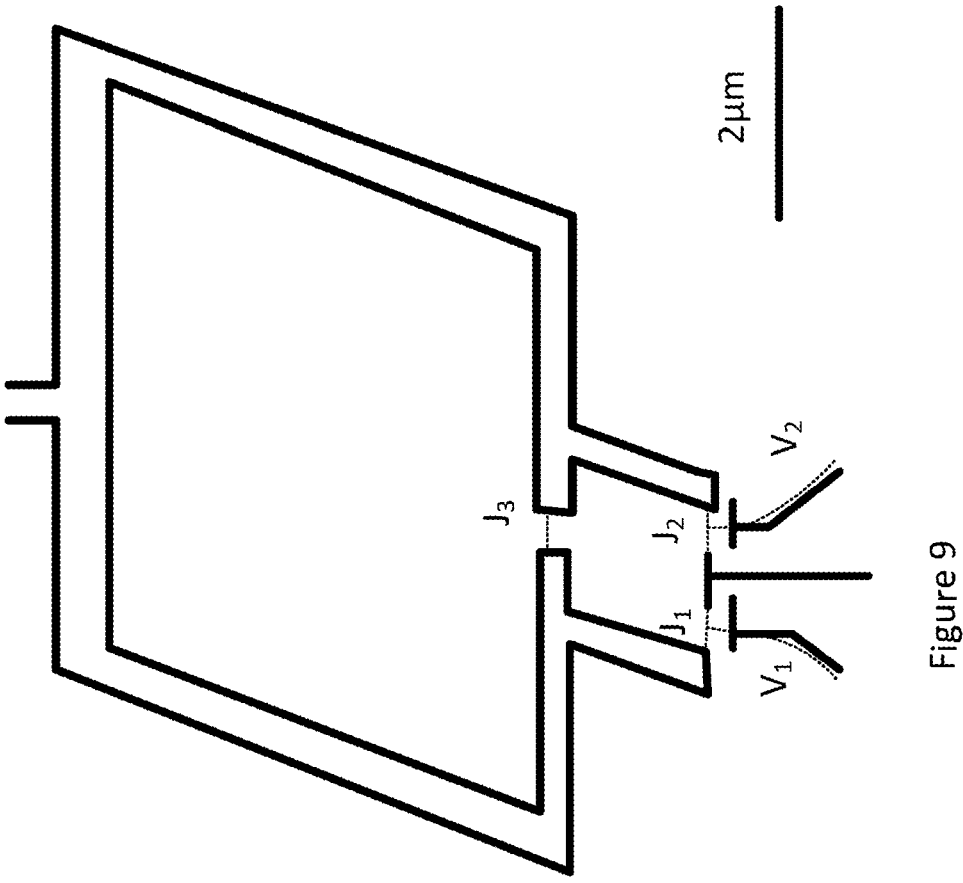
FIG. 9 is an image of a quantum magnetic field receiving device according to an embodiment of the present invention.

An embodiment of a quantum magnetic field receiving device 100 was fabricated by the inventors and is shown in FIG. 9. The inventors have demonstrated using the device 100 that, if the Josephson Junctions of a quantum receiver, fabricated based on superconducting materials, are tuneable by applying electrostatic fields to the junction material of each of the Josephson Junctions, respectively, the critical supercurrents of the Josephson Junctions can be tuned to improve the linearity of the magnetic flux-to-voltage response of the device 100. The fabricated device 100 differs from the device 10 shown in FIG. 3 by not having the third Josephson Junction $JJ_3$ connected to the electrostatic gating circuit 22.

The fabricated device 100 has two different layers of metallic materials that are deposited on a Silicon oxide surface with different angles of deposition. One layer is Aluminium (AI) and the other is Copper (Cu). FIG. 9 is a Scanning Electron Microscopy (SEM) image of the device 100. The device 100 is a BI-SQUID device, as described above, which is fabricated by two loops of superconducting material (Al which is superconducting when operating below 1K) containing a total of three Josephson junctions as above ($JJ_1$, $JJ_2$ and $JJ_3$).

In the implementation of the BI-SQUID device 100, only two of the three Josephson Junctions (J1 and J2) can be tuned by applying electrostatic fields to the Josephson Junctions' material. The Cu layer is ~20 nm thick while the Al one is ~100 nm thick and ~250 nm wide. The Cu parts of each Josephson Junction are all ~320 nm long and, while the Cu parts of J1 and J2 are ~130 nm wide, the one of J3 is 70 nm. The gate electrodes, which are used to tune critical supercurrents of the Josephson Junctions $JJ_1$ and $JJ_2$ are distant respectively ~80 nm for J1 (V1) and ~50 nm for J2 (V2). Loop B containing $JJ_1$ and $JJ_2$ is smaller than the other Loop A that contains $JJ_1$. In this device 100, the ratio between the area of Loop A and B is equal to 13. In this way, the magnetic field modulation response of the device 100 is dominated by the magnetic flux that penetrates in A and this is an essential feature that can be used to improve the performances of these devices.

Figure 10:
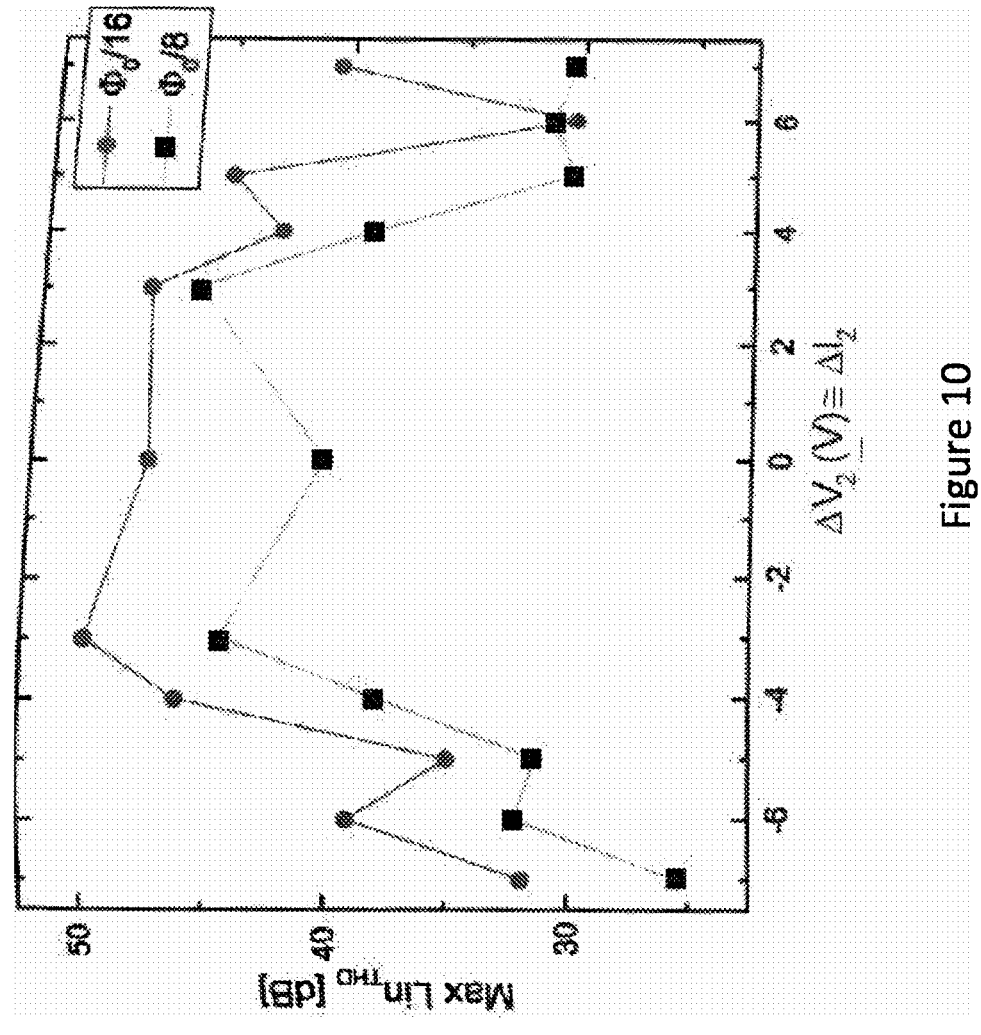
FIG. 10 is a graph of the linearity of magnetic flux-to-voltage response versus normalised loop inductance values of the quantum magnetic field receiving device of FIG. 9.

In FIG. 10, the inventors have demonstrated that, by changing the value of one gate ($V_2$), it is possible to almost double the value of maximum linearity in the voltage-magnetic flux response of the quantum sensor. Note that this FIG. 10 is equivalent to a cut with a fixed value of $I_{c3}$ and in the direction of varying $I_{c2}/I_{c1}$ in FIG. 7. Although the theoretical predictions in FIG. 7 were hinting to a sharper effect, the effect observed in FIG. 10 is equivalent to the result predicted theoretically. FIG. 10 shows that a device 100, based on a single BI-SQUID cell, can perform with such a high (~50 dB) linearity where the typical best number observed in the literature is never above 45 dB for arrays of at least several 100 of BI-SQUID cells.

In conclusion, the device 100 of FIG. 9 demonstrates that the Josephson Junctions of a quantum receiver fabricated with the shown geometry and based on superconducting materials can be tuneable by applying electrostatic fields to the junction material of each of the Josephson Junctions which then enables the tuning of critical supercurrents of the Josephson Junctions to improve the linearity of the magnetic flux-to-voltage response.

Finally, while the invention has been described in conjunction with a limited number of embodiments, it will be appreciated by those skilled in the art that many alternative, modifications and variations in light of the foregoing description are possible. Accordingly, the present invention is intended to embrace all such alternative, modifications and variations as may fall within the spirit and scope of the invention as disclosed.

The invention claimed is:

1. A quantum magnetic field receiving device comprising:
a superconducting quantum interference device (SQUID) including:
    a superconducting loop including a first arm spaced apart from a second arm;
    a first Josephson Junction in the first arm;
    a second Josephson Junction in the second arm;
    a third arm electrically connecting the first arm and the second arm; and
    a third Josephson Junction in the third arm, wherein each of the three Josephson Junctions has a junction material; and
an electrostatic gating circuit configured to apply a first electrostatic field to the first Josephson Junction and a second electrostatic field to the second Josephson Junction,
wherein a first critical supercurrent of the junction material of the first Josephson Junction is tuneable by applying the first electrostatic field to the junction material effected by a first gate voltage provided by the electrostatic gating circuit and a second critical supercurrent of the junction material of the second Josephson Junction is tuneable by applying the second electrostatic field to the junction material effected by a second gate voltage provided by the electrostatic gating circuit, and
wherein the first critical supercurrent is tuned to based on the second supercurrent to improve linearity of magnetic flux-to-voltage response of the quantum magnetic field receiving device,
wherein the first and the second critical supercurrent are tuned relative to a third critical supercurrent of the junction material of the third Josephson Junction, and
wherein the third critical supercurrent of the junction material of the third Josephson Junction is tuneable by applying a third electrostatic field to the junction material effected by a third gate voltage provided by the electrostatic gating circuit.

2. The quantum magnetic field receiving device of claim 1, wherein the SQUID is a Bi-SQUID.

3. The quantum magnetic field receiving device of claim 1 wherein the ratio of the first and the second critical supercurrent to the third critical supercurrent is 0.5 to 1.5.

4. The quantum magnetic field receiving device of claim 1, wherein an inductance in the first arm is tuned by the electrostatic gating circuit to substantially equal an inductance in the second arm.

5. The quantum magnetic field receiving device of claim 1, wherein an inductance in the first arm and an inductance in the second arm is tuned by the electrostatic gating circuit to optimise a Spurious Free Dynamic Range of the quantum magnetic field receiving device.

6. The quantum magnetic field receiving device of claim 5, wherein an optimised value of the Spurious Free Dynamic Range resulting from the tuning by the electrostatic gating circuit improves linearity of the magnetic flux-to-voltage response of the quantum magnetic field receiving device above 100 dB.

7. A quantum magnetic field receiving device comprising:
a superconducting quantum interference filter (SQIF) including:
    two or more superconducting loops, each including a first arm spaced apart from a second arm, wherein a second arm of a first superconducting loop forms a first arm of a second superconducting loop;
    a first Josephson Junction in the first arm of the first superconducting loop;

a second Josephson Junction in the second arm of the first superconducting loop which forms the first arm of the second superconducting loop; and a third Josephson Junction in the second arm of second superconducting loop, wherein each of the first, second and third Josephson Junctions has a junction material; and an electrostatic gating circuit configured to apply a first electrostatic field to the first Josephson Junction, a second electrostatic field to the second Josephson Junction, and a third electrostatic field to the third Josephson Junction, wherein a first critical supercurrent of the junction material of the first Josephson Junction is tuneable by applying the first electrostatic field to the junction material effected by a first gate voltage provided by the electrostatic gating circuit and a second critical supercurrent of the junction material of the second Josephson Junction is tuneable by applying the second electrostatic field to the junction material effected by a second gate voltage provided by the electrostatic gating circuit and a third critical supercurrent of the junction material of the third Josephson Junction is tuneable by applying the third electrostatic field to the junction material effected by a third gate voltage provided by the electrostatic gating circuit, and wherein the first, second and third critical supercurrents are tuned relative to each other to improve linearity of magnetic flux-to-voltage response of the quantum magnetic field receiving device.

8. The quantum magnetic field receiving device of claim 7, wherein an inductance in the first arm of the first superconducting loop is tuned by the electrostatic gating circuit based on an inductance in the second arm of the first superconducting loop.

9. The quantum magnetic field receiving device of claim 7, wherein an inductance in the first arm and an inductance in the second arm is tuned by the electrostatic gating circuit to optimise a Spurious Free Dynamic Range of the quantum magnetic field receiving device.

10. The quantum magnetic field receiving device of claim 9, wherein an optimised value of the Spurious Free Dynamic Range resulting from the tuning by the electrostatic gating circuit improves linearity of the magnetic flux-to-voltage response of the quantum magnetic field receiving device above 100 dB.

* * * * *